(12) United States Patent
Yen et al.

(10) Patent No.: US 9,246,016 B1
(45) Date of Patent: Jan. 26, 2016

(54) SILICON CARBIDE SEMICONDUCTOR DEVICE

(71) Applicant: Hestia Power Inc., Hsinchu (TW)

(72) Inventors: Cheng-Tyng Yen, Hsinchu (TW);
Chien-Chung Hung, Hsinchu (TW);
Chwan-Ying Lee, Hsinchu (TW);
Lurng-Shehng Lee, Hsinchu (TW)

(73) Assignee: HESTIA POWER INC., Hsinchu (TW)

( * ) Notice: Subject to any disclaimer, the term of this patent is extended or adjusted under 35 U.S.C. 154(b) by 0 days.

(21) Appl. No.: 14/668,299

(22) Filed: Mar. 25, 2015

(30) Foreign Application Priority Data

Jul. 2, 2014 (TW) .............................. 103122787 A

(51) Int. Cl.
*H01L 29/808* (2006.01)
*H01L 29/45* (2006.01)
*H01L 29/47* (2006.01)
*H01L 29/06* (2006.01)
*H01L 29/16* (2006.01)

(52) U.S. Cl.
CPC ............ *H01L 29/8083* (2013.01); *H01L 29/06* (2013.01); *H01L 29/1608* (2013.01); *H01L 29/45* (2013.01); *H01L 29/47* (2013.01)

(58) Field of Classification Search
None
See application file for complete search history.

(56) References Cited

U.S. PATENT DOCUMENTS

| 6,621,107 | B2 * | 9/2003 | Blanchard | H01L 29/7813 257/155 |
| 6,979,863 | B2 | 12/2005 | Ryu | |
| 2004/0183080 | A1 * | 9/2004 | Kusumoto | H01L 21/0485 257/77 |
| 2006/0202264 | A1 * | 9/2006 | Bhalla | H01L 29/1095 257/330 |
| 2009/0283776 | A1 * | 11/2009 | Iwamuro | H01L 29/7839 257/76 |
| 2012/0223339 | A1 * | 9/2012 | Mizukami | H01L 27/0727 257/77 |
| 2014/0175559 | A1 * | 6/2014 | Hung | H01L 29/7806 257/390 |

* cited by examiner

*Primary Examiner* — William Coleman
*Assistant Examiner* — Kien Ly
(74) *Attorney, Agent, or Firm* — Muncy, Geissler, Olds & Lowe, P.C.

(57) ABSTRACT

A silicon carbide (SiC) semiconductor device having a metal oxide semiconductor field effect transistor (MOSFET) and integrated with an anti-parallelly connected Schottky diode includes: a substrate, an n-drift layer, a plurality of doped regions, a gate dielectric layer, a gate electrode, an inter-layer dielectric layer, a plurality of source openings, a plurality of junction openings, a plurality of gate openings, a first metal layer and a second metal layer. The second metal layer at the junction openings forms the Schottky diode.

15 Claims, 9 Drawing Sheets

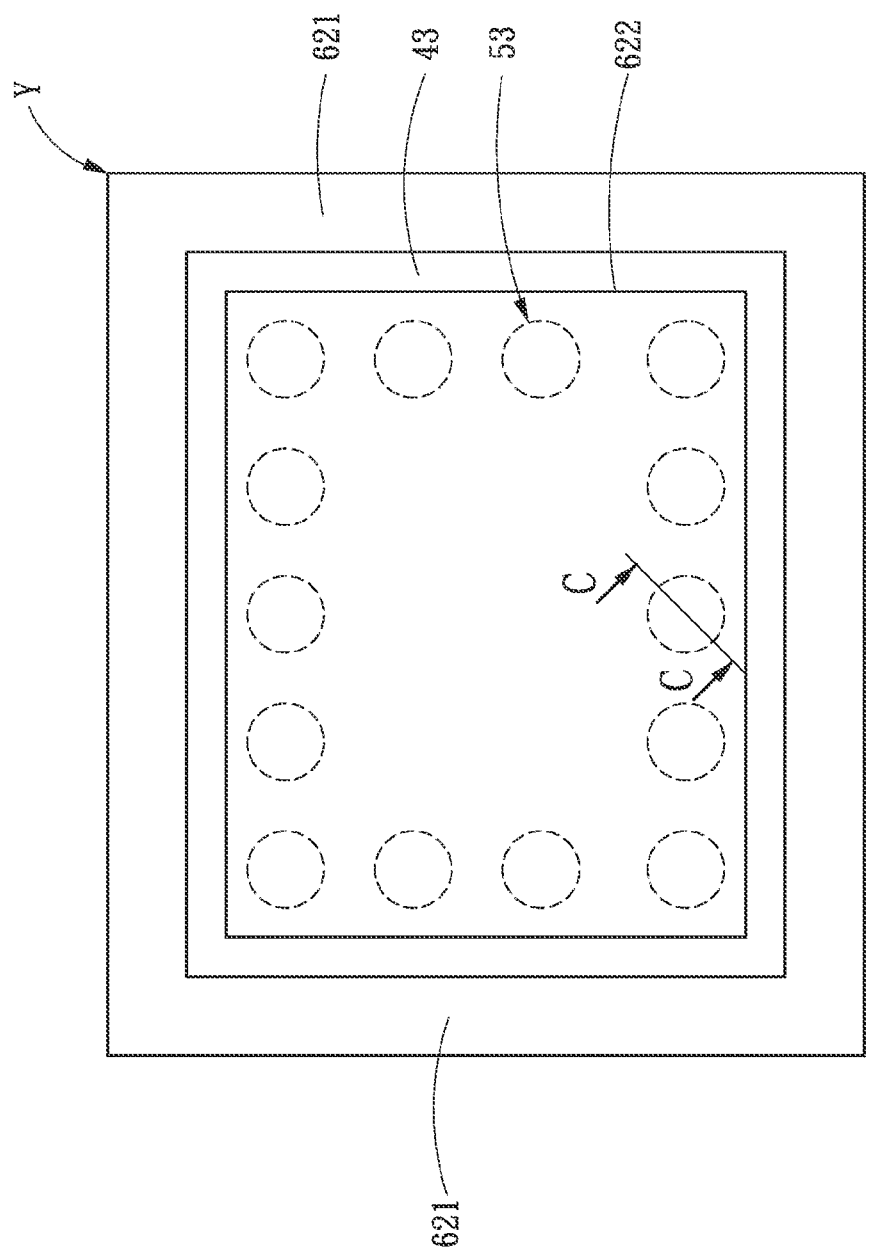

SILICON CARBIDE SEMICONDUCTOR DEVICE

FIELD OF THE INVENTION

The present invention relates to a semiconductor power device, and particularly to a silicon carbide (SiC) semiconductor power device.

BACKGROUND OF THE INVENTION

Power semiconductor devices should provide the minimum possible turn-on resistance, reverse leakage current and high switching speed at the rated breakdown voltage, to reduce the operational conduction loss and switching loss. The wide bandgap (Eg=3.26 eV), high threshold field of dielectric breakdown (2.2 MV/cm) and high thermal conductivity (4.9 W/cm-K) of silicon carbide (SiC) make it an ideal material for power switching devices. The thickness of voltage supporting layer (a low doping concentration drift layer) of power devices made of SiC is one-tenth of that made of silicon at the same rated blocking voltage, and the theoretical conduction resistance of SiC power devices can be hundreds times lower than Si power devices.

However, the wide bandgap of SiC also makes the turn-on voltage of body diode of SiC metal oxide semiconductor field effect transistor (MOSFET) reach to nearly 3V, which will result in a larger loss during switching and limit the switching speed. Furthermore, the basal plane dislocations happened during epitaxial growth of SiC drift layer will expand into stacking faults due to recombination of carriers during the forward conducting of body diode. SiC MOSFET's may degrade or even fail due to these stacking faults. Therefore, a SiC MOSFET sometimes co-packages an reverse-parallel connected SiC Schottky diode externally to increase the operating speed, reduce switching loss and avoid reliability issues brought by stacking faults.

In addition to externally connected with a Schottky diode, U.S. Pat. No. 6,979,863 discloses a SiC MOSFET integrated with a Schottky diode. In the SiC MOSFET of the above disclosure, the source metal and the Schottky metal are adjacent to each other which require additional layers in the manufacturing process to individually fabricate source contacts and Schottky contacts. Besides, to prevent the source metal erroneously contact to the drift layer and thus cause leakage current of the SiC MOSFET, greater tolerances in design rules need to be reserved to avoid yield loss. Thus, an effective gate width per unit area of the SiC MOSFET and a current density of the device may be undesirably affected, with costs further increased.

SUMMARY OF THE INVENTION

It is a primary object of the present invention to provide a SiC MOSFET device, which is integrated with a Schottky diode without involving an additional mask and provides preferred utilization efficiency.

To achieve the above object, a SiC semiconductor device is provided. The SiC semiconductor device includes a substrate, an n-drift layer, a plurality of doped regions, a gate dielectric layer, a gate electrode, an inter-layer dielectric layer, a plurality of source openings, a plurality of junction openings, a plurality of gate openings, a first metal layer and a second metal layer.

The substrate is heavily doped n-type. The n-drift layer is disposed on the substrate, and is lightly doped n-type compared to the substrate. The doped regions are disposed at the n-drift layer and spaced from each other, with a junction field effect transistor (JFET) region formed between the doped regions. Each of the doped regions includes a p-well, a heavily doped n-type (n+) region located in the p-well, and a heavily doped p-type (p+) region located in the p-well and surrounded by the n+ region. The gate dielectric layer is arranged on the n-drift layer. The gate electrode is disposed on the gate dielectric layer. The inter-layer dielectric layer is disposed on the gate dielectric layer and the gate electrode.

The source openings penetrate through the inter-layer dielectric layer and the gate dielectric layer to a surface portion of the n+ region and the p+ region. The source openings are separated by the gate electrode and the inter-layer dielectric layer. The junction openings penetrate through the inter-layer dielectric layer and the gate dielectric layer to a surface portion of the JFET region and the doped region. The junction openings are separated by the gate electrode and the inter-layer dielectric layer. The gate openings penetrate through the inter-layer dielectric layer to a surface portion of the gate electrode. The first metal layer is disposed at a bottom of the source openings to form an Ohmic contact with the surface portion of the n+ region and the p+ region. The second metal layer includes a first portion and a second portion. The first portion covers the junction openings and the source openings, is in contact and electrically connected with the first metal layer, and forms a Schottky contact with the surface portion of the JFET region. The second portion covers the gate openings and is electrically insulated from the first portion.

To achieve the above object, a SiC semiconductor device is further provided by the present invention. The SiC semiconductor device includes a substrate, an n-drift layer, a plurality of first doped regions, a plurality of second doped regions, a gate dielectric layer, a gate electrode, an inter-layer dielectric layer, a plurality of source openings, a plurality of junction openings, a plurality of gate openings, a first metal layer and a second metal layer. The substrate is heavily doped n-type. The n-drift layer is disposed on the substrate, and is lightly doped n-type compared to the substrate. The first doped regions are disposed at the n-drift layer and, and each includes a first p-well, a first n+ region disposed in the first p-well, and a first p+ region disposed in the first p-well and surrounded by the first n+ region. The second doped regions and the first doped regions are disposed at an interval at the n-drift layer. A JFET region is formed between the first doped region and the second doped region. Each of the second doped regions includes a second p-well surrounding a non-p-well region, a second p+ region surrounding the non-p-well region and a part or all of the second p+ region overlapping with the second p-well. The gate dielectric layer is disposed on the n-drift layer. The gate electrode is disposed on the gate dielectric layer. The inter-layer dielectric layer is disposed on the gate dielectric layer and the gate electrode.

The source openings penetrate through the inter-layer dielectric layer and the gate dielectric layer to a surface portion of the first n+ region and the first p+ region. The source openings are separated by the gate electrode and the inter-layer dielectric layer. The junction openings penetrate through the inter-layer dielectric layer and the gate dielectric layer to a surface portion of the second doped region. The junction openings are separated by the gate electrode and the inter-layer dielectric layer. The gate openings penetrate through the inter-layer dielectric layer to a surface portion of the gate electrode. The first metal layer is disposed at a bottom of the source openings, and forms an Ohmic contact with the surface portion of the first n+ region and the first p+ region. The second metal layer includes a first portion and a second portion. The first portion covers the junction openings and the source openings, is in contact and electrically connected with the first metal layer, and forms a Schottky contact with a surface portion of the non-p-well region. The second portion covers the gate openings and is electrically insulated from the first portion.

Thus, in the present invention, the source openings and the junction openings are separately arranged. Further, the first metal layer is formed at the bottom the source openings to form an Ohmic contact with only the n+ region (or the first n+ region) and the p+ region (or the first p+ region). As such, shorting between the lightly doped n-type n-drift layer and the first metal layer due to manufacturing variations can be avoided, thereby improving manufacturing yield.

The foregoing, as well as additional objects, features and advantages of the invention will be more readily apparent from the following detailed description, which proceeds with reference to the accompanying drawings.

BRIEF DESCRIPTION OF THE DRAWINGS

FIG. 3A is an enlarged view of an area Y in FIG. 1 according to the first embodiment of the present invention.

DETAILED DESCRIPTION OF THE PREFERRED EMBODIMENTS

Figure 1:
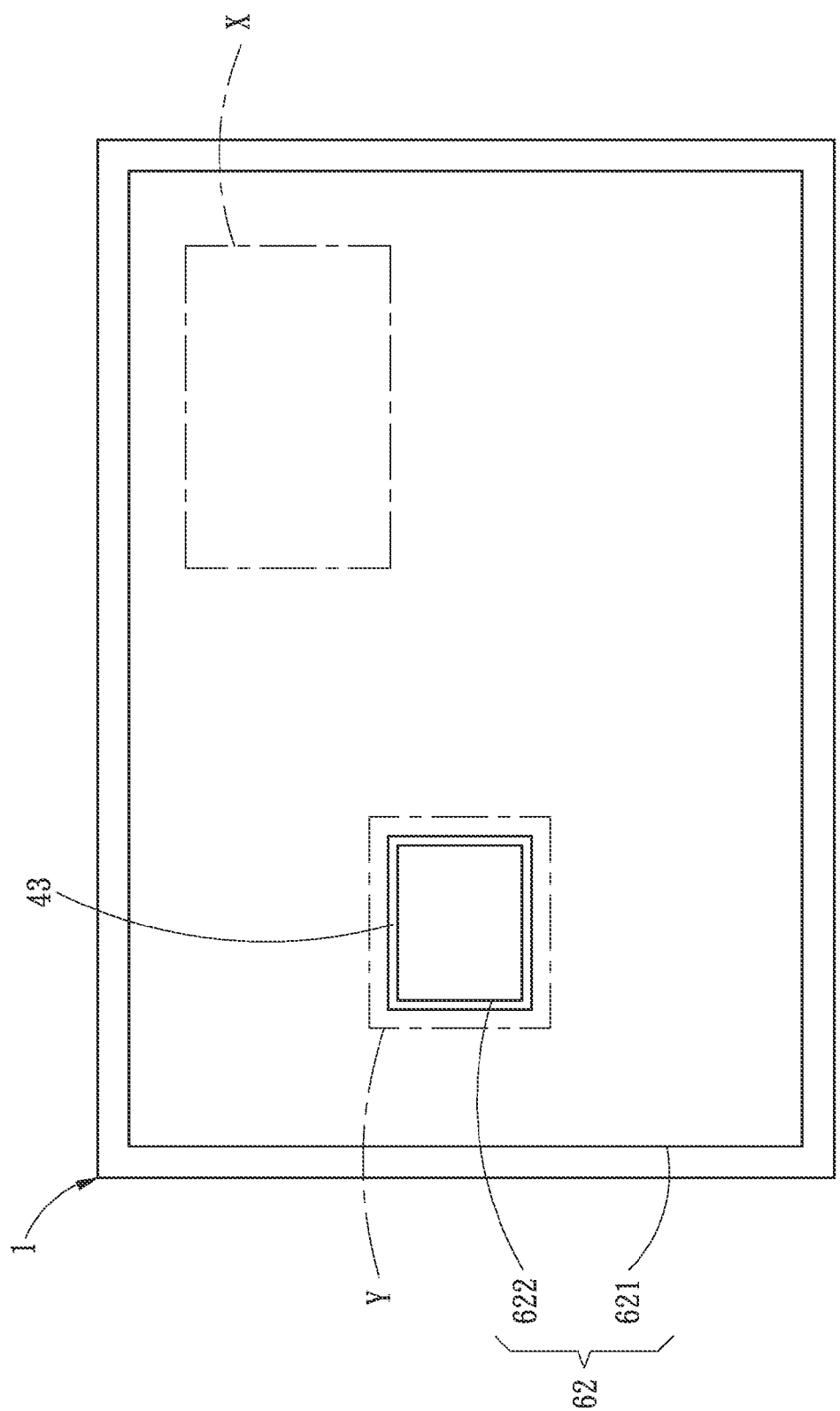
FIG. 1 is a top view of the present invention.
Figure 2A:
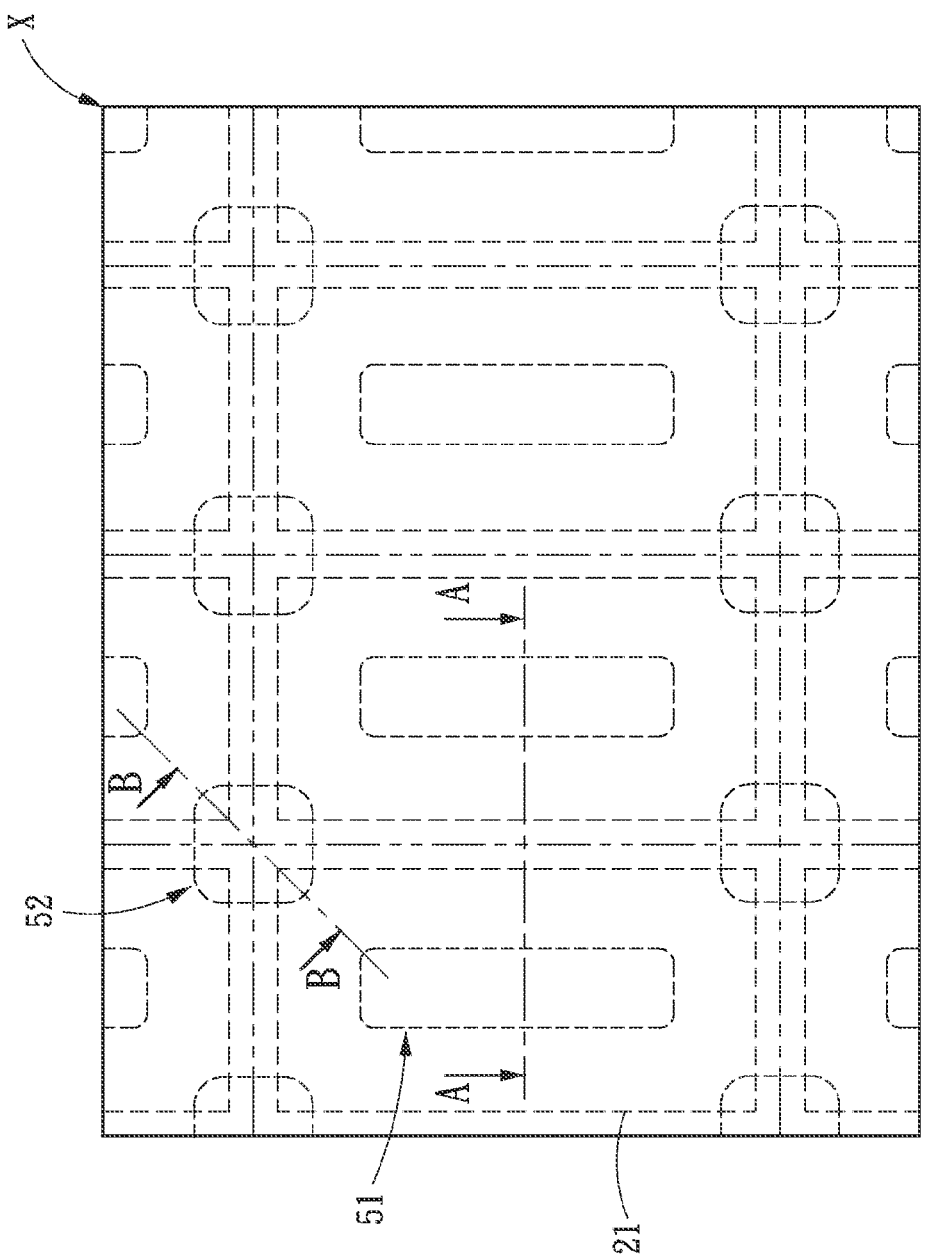
FIG. 2A is an enlarged view of an area X in FIG. 1 according to a first embodiment of the present invention.
Figure 2B:
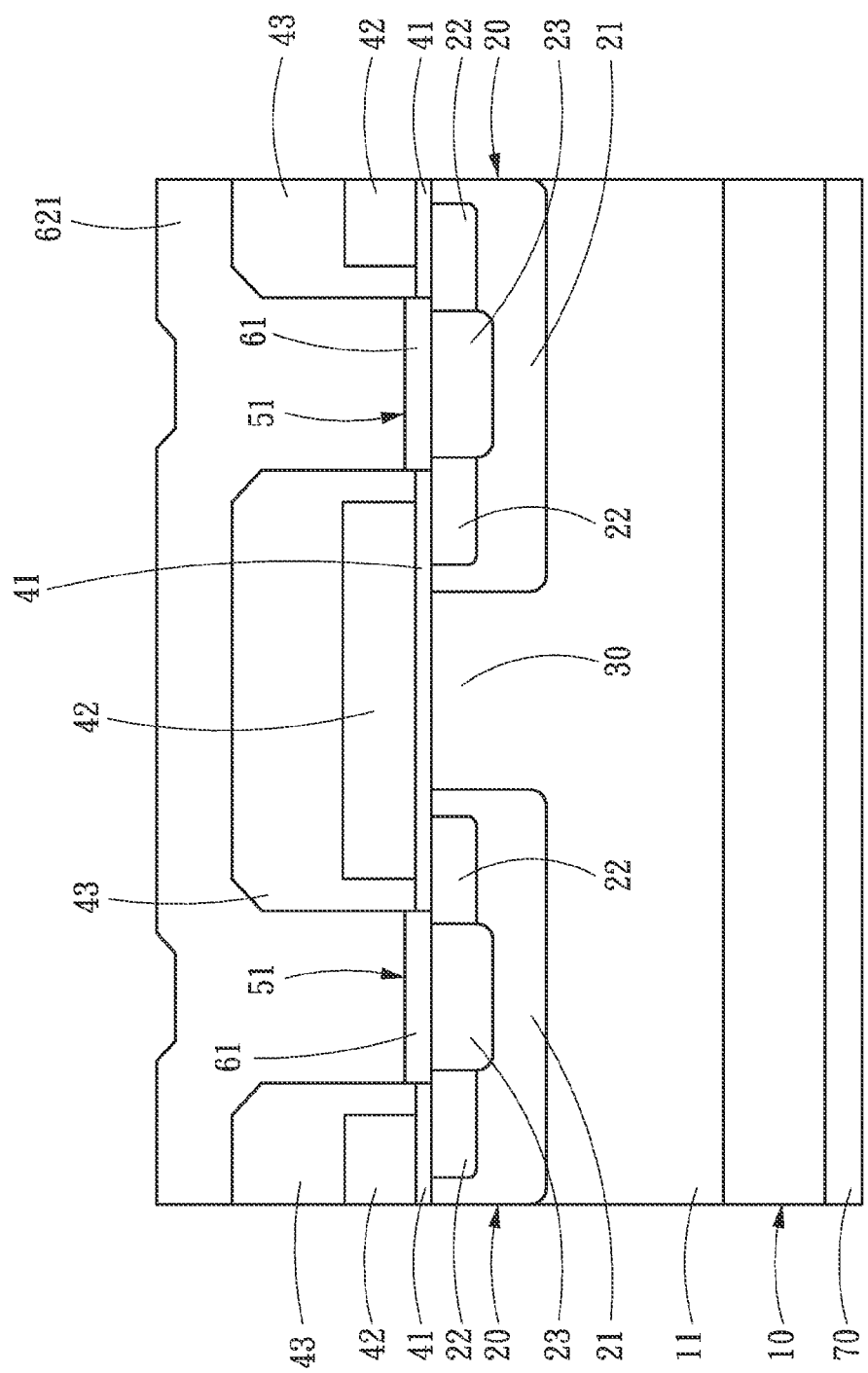
FIG. 2B is a sectional view along A-A of FIG. 2A.
Figure 2C:
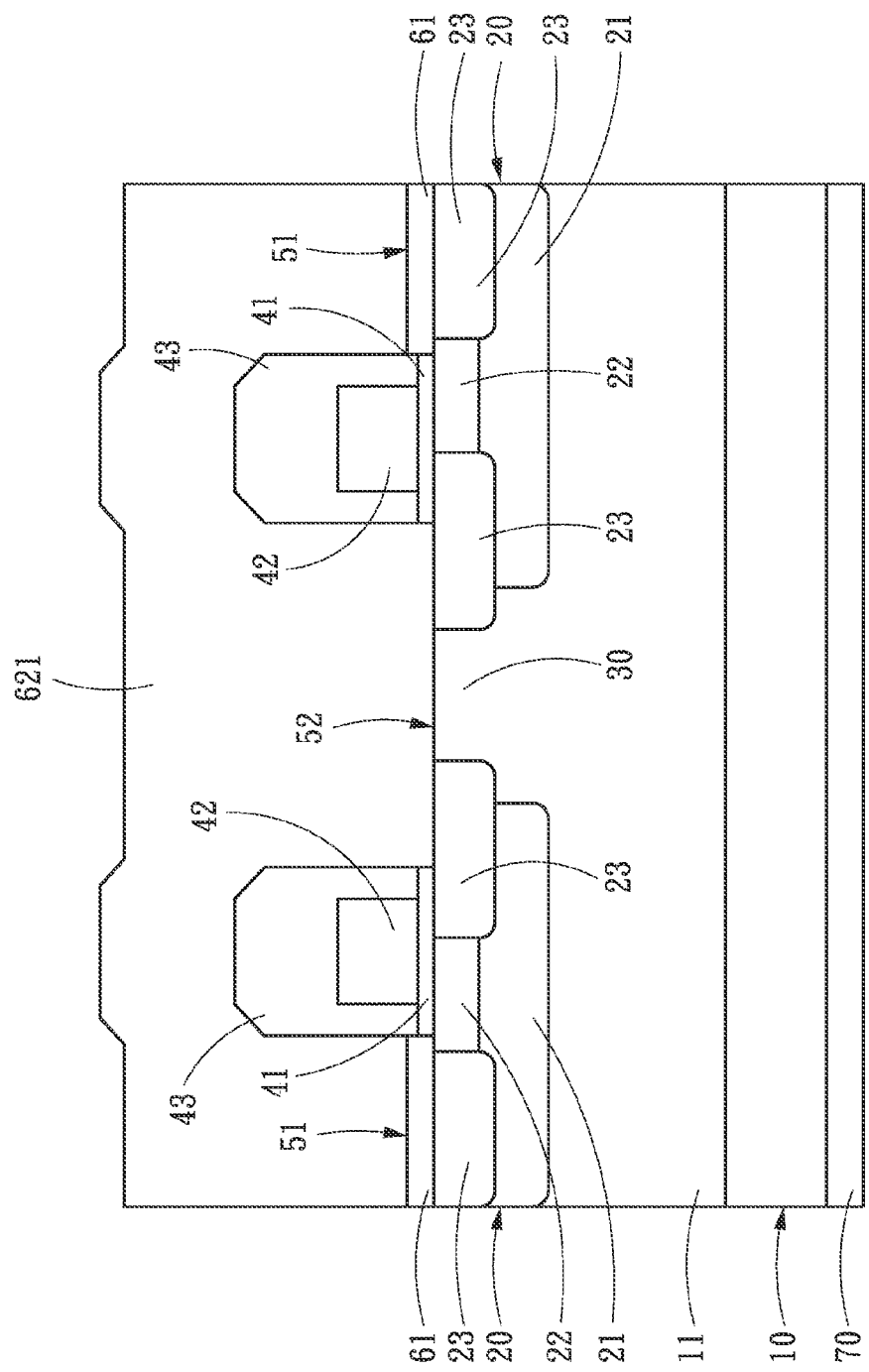
FIG. 2C is a sectional view along B-B of FIG. 2A.
Figure 3B:
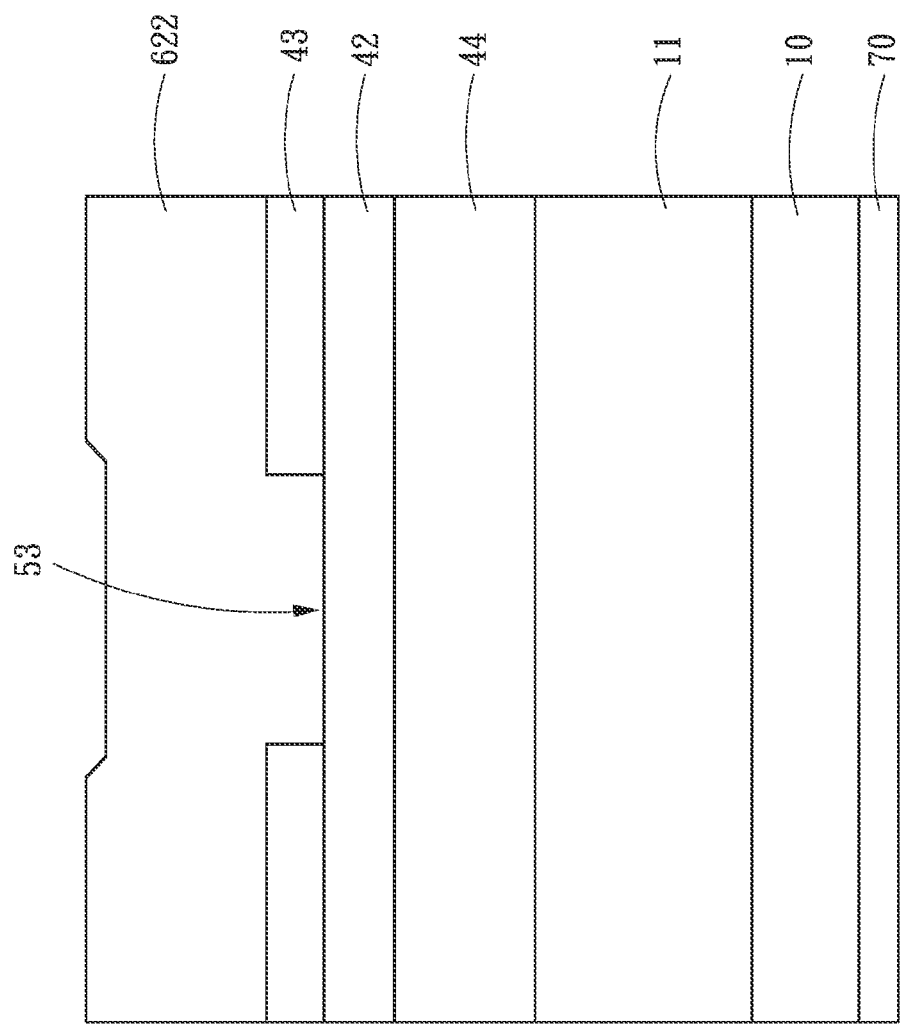
FIG. 3B is a sectional view along C-C of FIG. 3A.

FIG. 1 shows a top view of the present invention. FIG. 2A shows an enlarged view of an area X in FIG. 1 according to a first embodiment of the present invention. FIG. 2B shows a sectional view along A-A of FIG. 2A. FIG. 2C shows a sectional view along B-B of FIG. 2A. FIG. 3B shows an enlarged view of an area Y in FIG. 1. FIG. 3B shows a sectional view along C-C of FIG. 3A. Referring to FIG. 1, FIGS. 2A to 2C, and FIGS. 3A and 3B, a SiC semiconductor device 1 of the present invention includes a substrate 10, an n-drift layer 11, a plurality of doped regions 20, a gate dielectric layer 41, a gate electrode 42, an inter-layer dielectric layer 43, a plurality of source openings 51, a plurality of junction openings 52, a plurality of gate openings 53, a first metal layer 61, and a second metal layer 62.

Figure 2D:
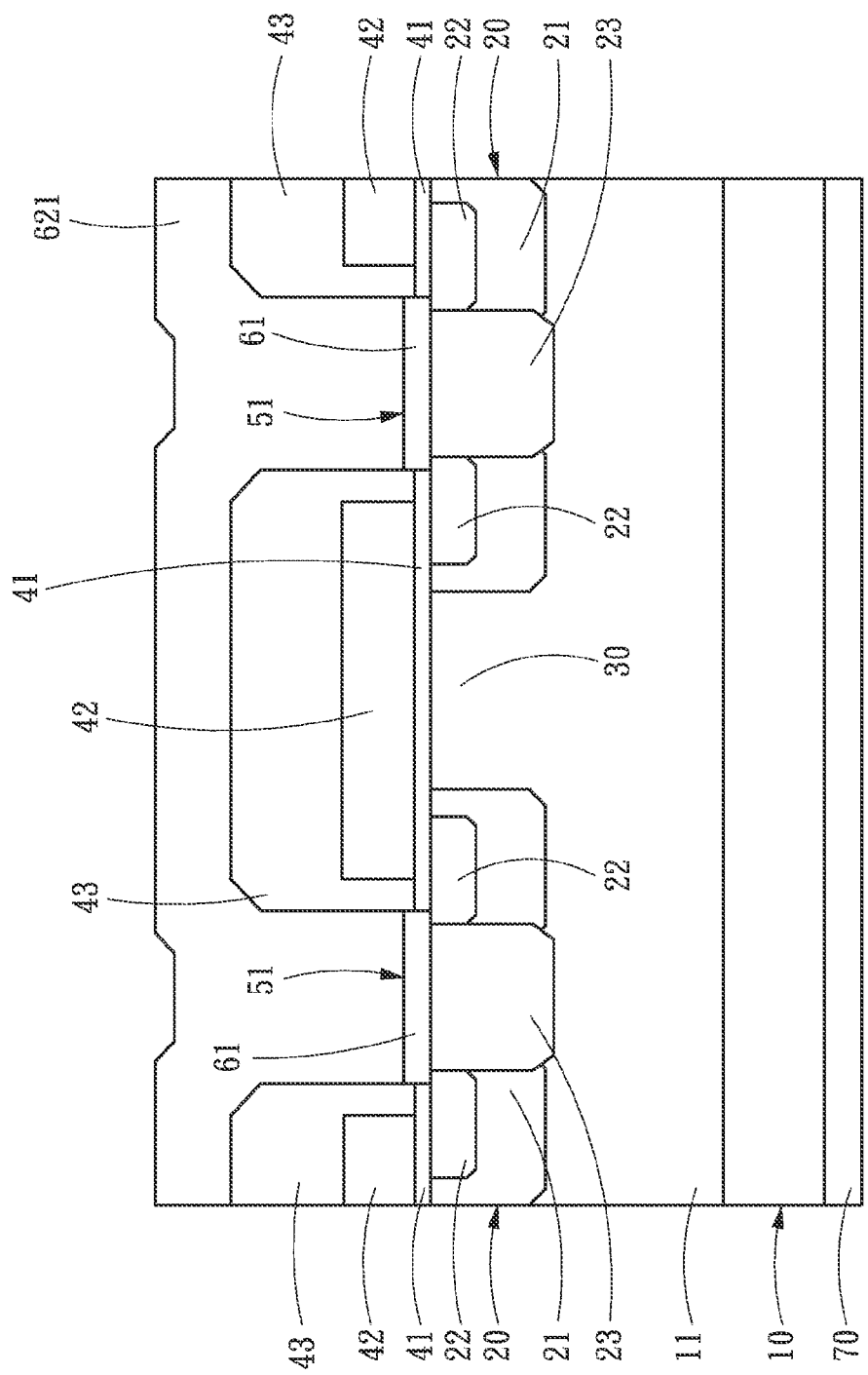
FIG. 2D is a sectional view along A-A of FIG. 2A according to another embodiment of the present invention.

Referring to FIG. 2B, the substrate 10 is a 4H-SiC substrate, and is heavily doped n-type with a concentration greater than $1E18$ $cm^{-3}$. The n-drift layer 11 is arranged on the substrate 10, and is n-type with a doping concentration smaller than that of the substrate 10. For example, the doping concentration of the n-drift layer 11 is between $1E14$ $cm^{-3}$ and $1E17$ $cm^{-3}$. The doped regions 20 are disposed at an interval at the n-drift layer 11, and each includes a p-well 21, a heavily doped n-type (n+) region 22, and a heavily doped p-type (p+) region 23. The p-well 21 has a doping concentration smaller than $1E19$ $cm^{-3}$. The n+ region 23 has a doping concentration greater than $1E19$ $cm^{-3}$, and is disposed in the p-well 21. The p+ region 23 has a doping concentration greater than $1E19$ $cm^{-3}$, and is surrounded by the n+ region 22 and is in contact with the p-well 21. In the embodiment, phosphorous or nitrogen may be implanted as the n type dopant, and aluminum or boron may be implanted as the p type dopant, with implantation energy between 10 keV and 1400 keV. In another embodiment, as shown in FIG. 2D, the p+ region 23 may be surrounded by the p-well 21 and the n+ region 22, and a part or all of the p+ region 23 overlaps with the p-well 21.

Again referring to FIG. 2B, a junction field effect transistor (JFET) region 30 is formed between the doped regions 20. The gate dielectric layer 41 is disposed on the n-drift layer 11, and may be made of a material such as $SiO_2$, nitride-containing $SiO_2$ or $Al_2O_3$ by thermal oxidation, chemical vapor deposition (CVD) or atomic layer deposition (ALD). The gate electrode 42 is disposed on the gate dielectric layer 41, and corresponds above the JFET region 30. The gate electrode 42 may be made of a material such as heavily doped n-type poly-Si with phosphorous as a dopant, or a heavily doped p-type poly-Si with boron as a dopant. The inter-layer dielectric layer 43 is disposed on the gate dielectric layer 41 and the gate electrode 42, and is made of a material such as tetra-ethyl-ortho-silicate (TEOS), boro-phospho-silicate-glass (BPSG), oxynitride, undoped silicate glass (USG) or silicon rich nitride (SRN).

The source openings 51 are formed by etching, and penetrate through the inter-layer dielectric layer 43 and the gate dielectric layer 41 to a surface portion of the n+ region 22 and the p+ region 23. The source openings 51 are separated by the gate electrode 42 and the inter-layer dielectric layer 43. Referring to FIG. 2C, the junction openings 52 are similarly formed by etching, and penetrate through the inter-layer dielectric layer 43 and the gate dielectric layer 41 to a surface portion of the JFET region 30 and the doped region 20. The junction openings 52 are separated by the gate electrode 42 and the inter-layer dielectric layer 43. Referring to FIGS. 3A and 3B, the gate openings 53 penetrate through the inter-layer dielectric layer 43 to a surface portion of the gate electrode 42. In the embodiment, the gate openings 53 are also formed by etching. A field oxide layer 44 is further provided between the gate electrode 42 and the n-drift layer 11.

The first metal layer 61 is disposed at a bottom of the source openings 51, and is a silicide or a combination of silicides of a material selected from a group consisting of nickel, titanium and aluminum. acted with SiC at an annealing temperature higher than 900° C. to form silicides. The unreacted materials are then removed by wet processes to have the first metal layer 61 remained at the bottom of the source openings 51. At the bottom of the source openings 51, the first metal layer 61 forms an Ohmic contact with the surface portion of the n+ region 22 and the p+ region 23. The second metal layer 62 may be made of a material such as titanium, molybdenum, nickel, aluminum, titanium silicide, molybdenum silicide, nickel silicide, aluminum silicide, titanium nitride, an aluminum copper alloy or an aluminum silicon copper alloy by PVD or CVD. The second metal layer 62 includes a first portion 621 and a second portion 622. The first portion 621 covers the junction openings 52 and the source openings 51, is in contact and electrically connected with the first metal layer 61 in the source openings 51, and forms a Schottky contact with the surface portion of the JFET region 30 in the junction openings 52. The second portion 622 covers the gate openings 53, and is not in contact with and electrically insulated from the first portion 621.

In one embodiment, the SiC semiconductor device 1 further includes a drain 70. The drain 70 is disposed at one side of the substrate 10 opposite to the n-drift layer 11. Accordingly, the SiC semiconductor device 1 forms a MOSFET integrated with an anti-parallelly connected junction barrier controlled Schottky rectifer.

As shown in FIG. 2A, in the first embodiment, for example, the SiC semiconductor device 1 is a design with a quadrilateral p-well 21 at the center and four junction openings 52 each being a quarter of a rounded rectangle at a corner to form a unit cell, thereby effectively utilizing the area of the device. In addition to the above shape, the unit cell may have a planar contour of a square, a hexagon or a long strip. In addition to the exemplary planar contour of a rounded rectangle, the planar contour of the junction openings 52 may be a triangle, a hexagon, an octagon or a circle, and may have a design adjustable according to the actual area of the device.

Figure 4:
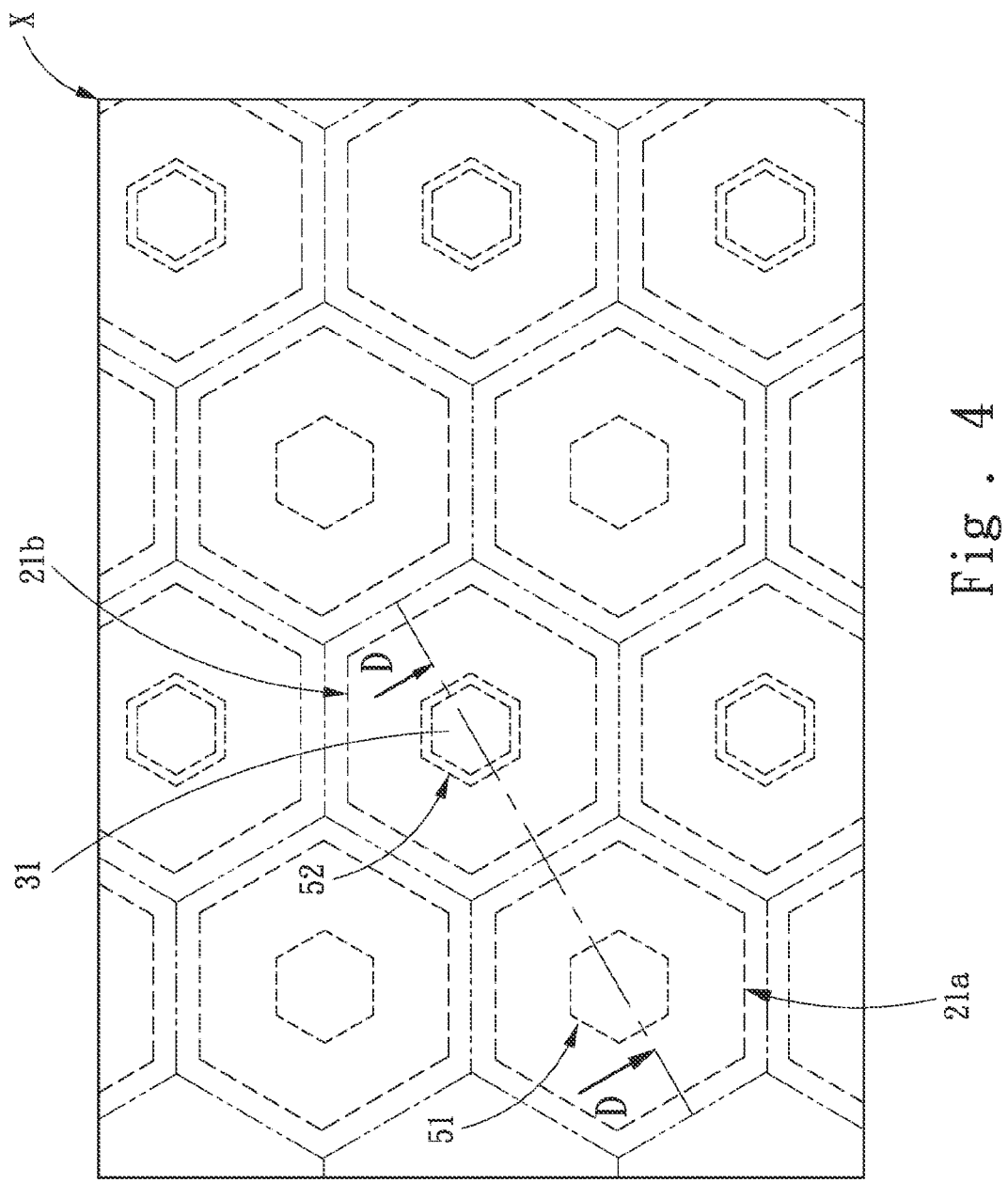
FIG. 4 is an enlarged view of the area X in FIG. 1 according to a second embodiment of the present invention.
Figure 5:
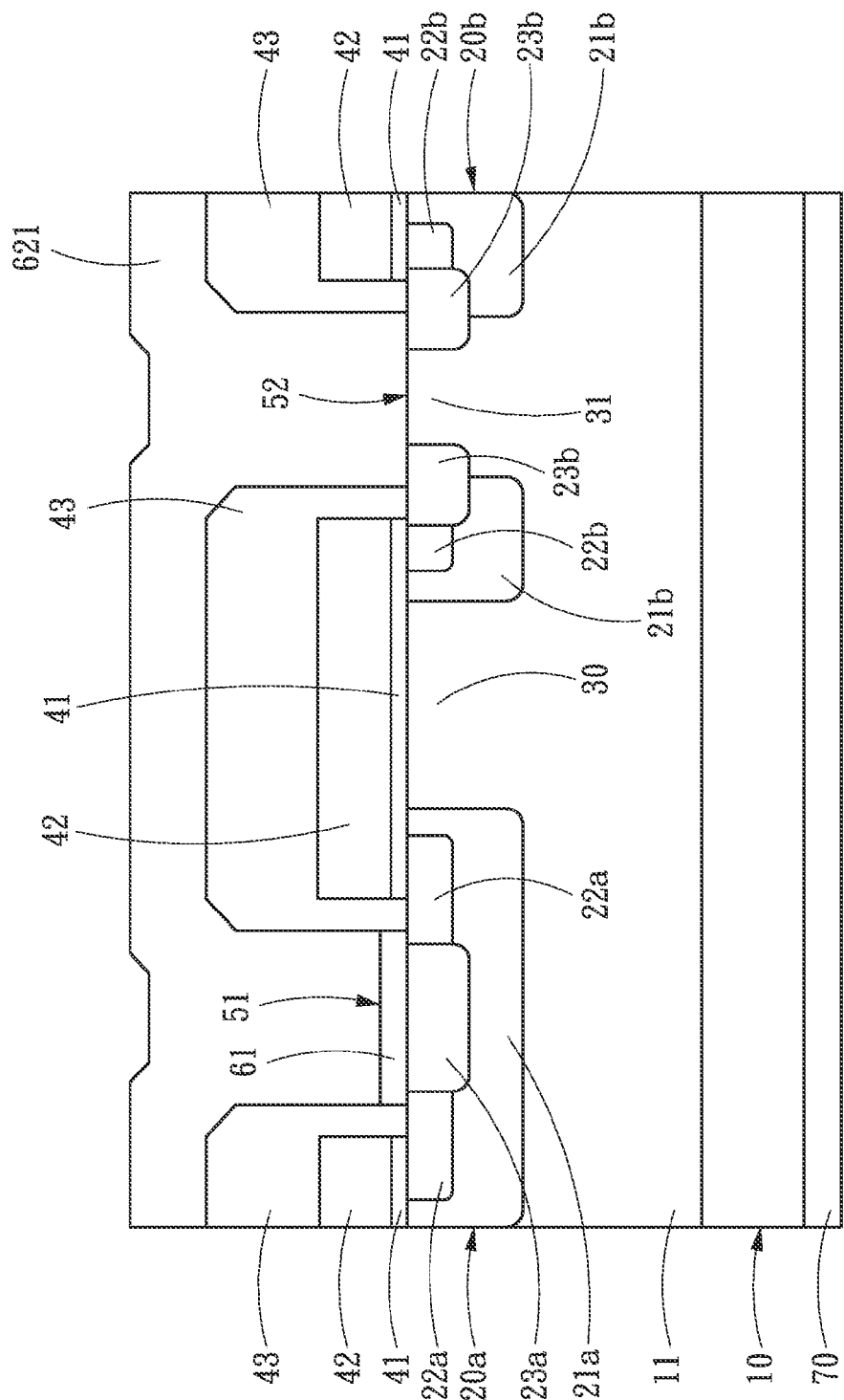
FIG. 5 is a sectional view along D-D of FIG. 4.

FIG. 4 shows an enlarged view of the area X in FIG. 1 according to a second embodiment of the present invention. FIG. 5 is a sectional view along D-D of FIG. 4. To achieve the above object, a SiC semiconductor device 1 is further provided by the present invention. The SiC semiconductor device 1 includes a substrate 10, an n-drift layer 11, a plurality of first doped regions 20a, a JFET region 30, a plurality of second doped regions 20b, a gate dielectric layer 41, a gate electrode 42, an inter-layer dielectric layer 43, a plurality of source openings 51, a plurality of junction openings 52, a plurality of gate openings 53, a first metal layer 61 and a second metal layer 62.

In the second embodiment, for example, the unit cell has a planar contour of a hexagon. In other embodiments, the unit cell may be a rectangle, a quadrilateral or a long strip.

In the second embodiment, the substrate 10 is a 4H-SiC substrate, and is heavily doped n-type with a concentration greater than $1E18$ $cm^{-3}$. The n-drift layer 11 is disposed on the substrate 10, and is n-type with a doping concentration smaller than that of the substrate 10. For example, the doping concentration of the n-drift layer 11 is between $1E14$ $cm^{-3}$ and $1E17$ $cm^{-3}$.

The first doped regions 20a and the second doped regions 20b are disposed at an interval at the n-drift layer 11. The JFET region 30 is formed between the first doped regions 20a and the second doped regions 20b. Each of the first doped regions 20a includes a first p-well 21a, a first n+ region 22a, and a first p+ region 23a. The first n+ region 22a is disposed in the first p-well 21a. The first p+ region 23a is surrounded by the first n+ region 22a, and is contact with the first p-well 21a. Each of the second doped regions 20b includes a second p-well 21b, a second n+ region 22b and a second p+ region 23b. The second p-well 21b surrounds a non-p-well region 31. The second n+ region 22b is disposed in the second p-well 21b. A part or all of the second p+ region 23b overlaps with the second p-well 21b, is adjacent to the second n+ region 22b, and extends to the non-p-well region 31. It should be noted that, although this embodiment includes the second n+ region 22b, the second n+ region 22b may be excluded in another embodiment, and operations of the SiC semiconductor device 1 are not affected. The doping concentrations and implantation energies of the first doped regions 20a and the second doped regions 20b may correspond to the doping concentrations and implantation energies of the doped regions 20, and shall be omitted herein.

The gate dielectric layer 41 is disposed on the n-drift layer 11, and may be similarly made of a material such as $SiO_2$, nitride-containing $SiO_2$ or $Al_2O_3$ by thermal oxidation, CVD or ALD. The gate electrode 42 is disposed on the gate dielectric layer 41. The gate electrode 42 may be made of a material such as heavily doped n-type poly-Si with phosphorous as a dopant, or a heavily doped p-type poly-Si with boron as a dopant. The inter-layer dielectric layer 43 is disposed on the gate dielectric layer 41 and the gate electrode 42, and is made of a material such as TEOS, BPSG, oxynitride, USG or SRN. Further, in the second embodiment, positions and structures of the gate openings 53 are identical to those in the first embodiment, and may be referred from FIGS. 3A and 3B. Associated details shall be omitted herein.

Accordingly, compared to the first embodiment, the source openings 51 of the second embodiment penetrate through the inter-layer dielectric layer 43 and the gate dielectric layer 41 to a surface portion of the first n+ region 22a and the first p+ region 23a to correspond above the first doped region 20a. The source openings 51 are separated by the gate electrode 42 and the inter-layer dielectric layer 43. The junction openings 52 penetrate through the inter-layer dielectric layer 43 and the gate dielectric layer 41 to a surface portion of the second p+ region 23b of the second doped region 20b and the non-p-well region 31. The junction openings 52 are spaced by the gate electrode 42 and the inter-layer dielectric layer 43. The gate openings 53 penetrate through the inter-layer dielectric layer 43 to a surface portion of the gate electrode 42.

The first metal layer 61 is disposed at the bottom of the source openings 51, and forms an Ohmic contact with the surface portion of first n+ region 22a and the first p+ region 23a. The second metal layer 62 includes a first portion 621 and a second portion 622. The first portion 621 covers the junction openings 52 and the source openings 51, is in contact and electrically connected with the first metal layer 61, and forms a Schottky contact with a surface portion of the non-p-well region 31. The second portion 622 covers the gate openings 53, and is not in contact with and thus electrically insulated from the first portion 621. It should be noted that, details of manufacturing processes for forming the source openings 51, the junction openings 52 and the gate openings 53 as well as the materials of the first metal layer 61 and the second metal layer 62 may be referred from the corresponding description of the first embodiment, and shall be omitted herein.

In conclusion, in the present invention, the source openings and the junction openings are separately disposed. In the manufacturing process, the source openings are first manufactured and the first metal layer is formed, and gate openings and the junction openings are manufactured, followed by forming the second metal layer, thereby forming a good Schottky contact by the second metal layer at the junction openings with SiC. Further, the first metal layer is formed at the bottom of the source openings to form an Ohmic contact with only the n+ region (or the first n+ region) and the p+ region (or the first p+ region). As such, shorting between the lightly doped n-type n-drift layer and the first metal layer due to manufacturing variations can be avoided, thereby improving manufacturing yield.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A silicon carbide (SiC) semiconductor device, comprising:
   a substrate, having heavily doped n-type;
   an n-drift layer, disposed on the substrate, having lightly doped n-type compared to the substrate;
   a plurality of doped regions, disposed at the n-drift layer, spaced from each other and formed a junction field effect transistor (JFET) region therebetween, each of the doped regions comprising a p-well, a heavily doped n-type (n+) region located in the p-well, and a heavily doped p-type (p+) region located in the p-well and surrounded by the n+ region;
a gate dielectric layer, disposed on the n-drift layer;
a gate electrode, disposed on the gate dielectric layer;
an inter-layer dielectric layer, disposed on the gate dielectric layer and the gate electrode;
a plurality of source openings, penetrating through the inter-layer dielectric layer and the gate dielectric layer to a surface portion of the n+ region and the p+ region and are separated by the gate electrode and the inter-layer dielectric layer;
a plurality of junction openings, penetrating through the inter-layer dielectric layer and the gate dielectric layer to a surface portion of the JFET region and the doped regions are separated by the gate electrode and the inter-layer dielectric layer;
a plurality of gate openings, penetrating through the inter-layer dielectric layer to a surface portion of the gate electrode;
a first metal layer, disposed at a bottom of the source openings, formed an Ohmic contact with the surface portion of the n+ region and the p+ region; and
a second metal layer, comprising a first portion and a second portion wherein the first portion covers the source openings and the junction openings is electrically connected to the first metal layer and forms a Schottky contact with the surface portion the JFET region; the second portion covers the gate openings and is electrically insulated from the first portion.

2. The SiC semiconductor device of claim 1, wherein the p+ region is surrounded by the p-well and the n+ region, and a part or all of the p+ region overlaps with the p-well.

3. The SiC semiconductor device of claim 1, wherein the substrate is a 4H-SiC substrate.

4. The SiC semiconductor device of claim 1, wherein the first metal layer is a silicide or a combination of silicides of a material selected from a group consisting of nickel, titanium and aluminum.

5. The SiC semiconductor device of claim 1, wherein the second metal layer is selected from a group or a combination consisting of titanium, molybdenum, nickel, aluminum, titanium silicide, molybdenum silicide, nickel silicide, aluminum silicide, titanium nitride, an aluminum copper alloy and an aluminum silicon copper alloy.

6. The SiC semiconductor device of claim 1, wherein a planar contour of the p-well is a square, a rectangle or a hexagon.

7. The SiC semiconductor device of claim 1, wherein a planar contour of the junction openings is a quadrilateral, a hexagon, an octagon or a circle.

8. A silicon carbide (SiC) semiconductor device, comprising:
a substrate, having heavily doped n-type;
a n-drift layer, disposed on the substrate, having lightly doped n-type compared to the substrate;
a plurality of first doped regions, disposed at the n-drift layer, each of the first doped regions comprising a first p-well, a first n+ region arranged in the first p-well, and a first p+ region arranged in the first p-well and surrounded by the first n+ region;
a plurality of second doped regions, disposed at the n-drift layer and spaced from the first doped regions to form a JFET region between the first doped region and the second doped region, each of the second doped regions comprising a second p-well surrounding a non-p-well region, and a second p+ region surrounding the non-p-well region and a part or all of the p+ region overlaps with the second p-well;
a gate dielectric layer, disposed on the n-drift layer;
a gate electrode, disposed on the gate dielectric layer;
an inter-layer dielectric layer, disposed on the gate dielectric layer and the gate electrode;
a plurality of source openings, penetrating through the inter-layer dielectric layer and the gate dielectric layer to a surface portion of the first n+ region and the first p+ region, and are separated by the gate electrode and the inter-layer dielectric layer;
a plurality of junction openings, penetrating through the inter-layer dielectric layer and the gate dielectric layer to a surface portion of the second doped region, and are separated by the gate electrode and the inter-layer dielectric layer;
a plurality of gate openings, penetrating through the inter-layer dielectric layer to a surface portion of the gate electrode;
a first metal layer, disposed at a bottom of the source openings, formed an Ohmic contact with the surface portion of the first n+ region and the first p+ region; and
a second metal layer, comprising a first portion and a second portion wherein the first portion covers the source openings and the junction openings and is electrically connected to the first metal layer and forms a Schottky contact with a surface portion of the non-p-well region, the second portion covers the gate openings and is electrically insulated from the first portion.

9. The SiC semiconductor device of claim 8, wherein the first p+ region is surrounded by the first p-well and the first n+ region, and a part or all of the first p+ region overlaps with the first p-well.

10. The SiC semiconductor device of claim 8, wherein each of the second doped regions further comprises a second n+ region arranged in the second p-well and adjacent to the second p+ region.

11. The SiC semiconductor device of claim 8, wherein the substrate is a 4H-SiC substrate.

12. The SiC semiconductor device of claim 8, wherein the first metal layer is a silicide or a combination of silicides of a material selected from a group consisting of nickel, titanium and aluminum.

13. The SiC semiconductor device of claim 8, wherein the second metal layer is selected from a group or a combination consisting of titanium, molybdenum, nickel, aluminum, titanium silicide, molybdenum silicide, nickel silicide, aluminum silicide, titanium nitride, an aluminum copper alloy and an aluminum silicon copper alloy.

14. The SiC semiconductor device of claim 8, wherein a planar contour of the first p-well is a square, a rectangle or a hexagon, and a planar contour of the second p-well is a square, a rectangle or a hexagon.

15. The SiC semiconductor device of claim 8, wherein a planar contour of the junction openings is a quadrilateral, a hexagon, an octagon or a circle.

* * * * *